(12) United States Patent
Maruyama et al.

(10) Patent No.: US 7,403,024 B2
(45) Date of Patent: Jul. 22, 2008

(54) CONTACTOR HAVING CONTACT ELECTRODES OF METAL SPRINGS EMBEDDED IN A PLATE-LIKE STRUCTURE

(75) Inventors: Shigeyuki Maruyama, Kawasaki (JP); Kazuhiro Tashiro, Kawasaki (JP); Naoyuki Watanabe, Kawasaki (JP); Daisuke Koizumi, Kawasaki (JP); Takafumi Hashitani, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/900,362

(22) Filed: Jul. 28, 2004

(65) Prior Publication Data

US 2004/0266272 A1   Dec. 30, 2004

Related U.S. Application Data

(62) Division of application No. 10/059,114, filed on Jan. 31, 2002, now Pat. No. 6,791,345.

(30) Foreign Application Priority Data

Feb. 2, 2001   (JP) ............... 2001-027399

(51) Int. Cl.
   *G01R 31/26* (2006.01)
(52) U.S. Cl. ...................... 324/754; 324/761
(58) Field of Classification Search ......... 324/754–762; 439/62–72, 482
   See application file for complete search history.

(56) References Cited

U.S. PATENT DOCUMENTS

| 4,423,376 A | 12/1983 | Byrnes et al. ............... 324/756 |
| 4,528,500 A | 7/1985 | Lightbody et al. .......... 324/537 |
| 5,163,834 A * | 11/1992 | Chapin et al. ................. 439/66 |
| 5,166,602 A * | 11/1992 | Byford et al. ............... 324/754 |
| 5,475,317 A * | 12/1995 | Smith .......................... 324/760 |
| 5,509,203 A * | 4/1996 | Yamashita ..................... 29/879 |
| 5,635,846 A * | 6/1997 | Beaman et al. ............. 324/754 |
| 5,800,184 A | 9/1998 | Lopergolo et al. ............. 439/66 |
| 5,821,763 A * | 10/1998 | Beaman et al. ............. 324/754 |
| 5,913,687 A * | 6/1999 | Rathburn ..................... 439/66 |
| 6,294,922 B1 | 9/2001 | Okubo et al. ............... 324/761 |

FOREIGN PATENT DOCUMENTS

JP   62-174263   *   7/1987

* cited by examiner

*Primary Examiner*—Vinh P Nguyen
(74) *Attorney, Agent, or Firm*—Kratz, Quintos & Hanson, LLP

(57) ABSTRACT

A contactor has contact electrodes elastically deformable in a direction of thickness of the contactor so that the contactor can make a contact with a semiconductor device with an appropriate contact pressure. The contactor is positioned between the semiconductor device and a test board so as to electrically connect the semiconductor device to the test board. Each of a plurality of contact electrodes has a first contact electrode part, a second contact electrode part and a connecting part electrically connecting the first contact electrode part to the second contact electrode part. The first contact electrode part contacts an electrode of the semiconductor device. The second contact electrode part contacts a terminal of the test board. A combining member has an insulating characteristic and holds the connecting part of each of the contact electrodes in a predetermined arrangement.

3 Claims, 13 Drawing Sheets

$\theta_1 > \theta_2$

CONTACTOR HAVING CONTACT ELECTRODES OF METAL SPRINGS EMBEDDED IN A PLATE-LIKE STRUCTURE

This application is a Divisional application of U.S. application Ser. No. 10/059,114, filed Jan. 31, 2002, now U.S. Pat. No. 6,791,345, and hereby entirely incorporated herein by reference.

BACKGROUND OF THE INVENTION

1. Field of the Invention

The present invention generally relates to a contactor for electronic products and, more particularly, to a contactor for contacting electrodes of a semiconductor device to achieve a conductive connection so as to examine the semiconductor device such as a large-scale semiconductor integrated circuit (LSI) and a manufacturing method of such a contactor.

In recent years, manufacturing technology of a semiconductor substrate or the like has accomplished remarkable development. In connection with the development, circuit patterns of semiconductor devices such as an LSI have been changed to a fine structure, and an increase in the number of terminals and miniaturization of terminals have also been progressed with remarkable speed.

Moreover, high-density mounting is also required for electronic equipment using a semiconductor device. For example, the number of portable devices that require a small size and high performance, such as a mobile telephone, a mobile personal computer or a video-equipped camera, has increased rapidly. Moreover, a demand for a highly efficient computer, which minimize a distance between adjacent LSIs so as to guarantee a high-speed operation, has also increased rapidly.

For this reason, the form of shipment of semiconductor devices such as LSIs that the LSI chips are delivered with guarantee of its function has been increasing. Such a form of shipment is referred to as known good die (KGD). Moreover, the number of shipments of the chip-size package (CSP), which is a semiconductor devices packaged in the same size as the LSI chip, has also been increasing rapidly.

In the above-mentioned situation, in order to examine semiconductor devices such as LSI, a supply of contactors, which can make reliable electric contact with many terminals formed as a part of fine circuit patters, has become indispensable.

Moreover, in view of an increase in efficiency of an LSI test, a demand has become large for performing all tests including a final test (FT) and a burn in test (BI) as a wafer on which a plurality of LSIs are formed in the LSI manufacturing process.

The full test in a wafer state is effective in maintaining good handling efficiency rather than testing in the state where chips are separated from each other. That is, although the versatility of handling equipment will be lost if the sizes of chips differ from each other, bulk conveyance can be made in the wafer state since an outer configuration of wafers is standardized.

Moreover, there is an advantage that information regarding defective chips can be managed according to a wafer map. Furthermore, a manufacturing process of the wafer level CSP, of which development has been progressing in recent years, is manageable in the wafer state up to an assemble process. For this reason, if a test in the wafer state is realized, chips can be handled in the wafer state throughout the process from a wafer process to packaging (assembly) and testing, thereby achieving an efficient manufacturing process of LSI.

Therefore, it is desirous to develop a contactor which can contact many fine-structure pins of an LSI with corresponding terminals of a test board.

2. Description of the Related Art

Conventionally, the following contactors are used as a contactor for an LSI examination: 1) a contactor using a needle-type mechanical probe; 2) a contactor using a membrane probe; and 3) a contactor using an anisotropic conductive rubber.

1) Contactor Using a Needle-type Mechanical Probe 1-1) Cantilever Probe

The contactor using a cantilever-type mechanical probe is formed by arranging needles (formed of a tungsten wire or the like) in positions on a contactor substrate corresponding to positions of terminals of an LSI to be tested. Generally, each needle is constituted so as to extend toward a terminal of the LSI in an inclined state with respect to the LSI.

The contactor using the cantilever probe is used mainly for a peripheral-terminal LSI for a bare wafer. However, such a contactor has a large length of each needle (generally, 20 mm or more), and it is difficult to be used for an LSI having area array terminals. Moreover, since roots of the probes are arranged around one LSI, contact electrodes for an adjacent LSI cannot be formed.

For this reason, a perpendicular probe has attracted attention in recent years. The perpendicular probe is a probe in which contact electrode pins are arranged at the same pitch as LSI terminal so as to acquire a contact action and a contact force sorely by bending of the probe in a vertical direction.

1-2) Spring Probe

A coil spring is used as a contact electrode pin. For example, coil springs are arranged and resin or rubber is filled therebetween so as to connect mutually. The interval of adjacent coil springs is determined by a pitch of terminals of an LSI and a diameter of the coil springs. That is, the interval of adjacent springs is a value obtained by subtracting the diameter of the coil springs from the pitch of the terminals of the LSI.

2) Contactor Using Membrane-type Probe

A membrane-type probe is formed as a film-like circuit board having a metal projection (herein after, referred to as a bump) as a contact electrode for probes. For example, a wiring layer is formed in a flexible thin film insulation substrate (polyimide substrate, etc.), and projections (bumps) are formed in the portion equivalent to the contact electrode terminal parts of the wiring layer by plating etc. As for this method, a contact electrode is beforehand formed on an insulating substrate. There is no problem resulting from the interval of adjacent contact electrodes like a mechanical probe.

3) Contactor Using an Anisotropic Conductive Rubber

An anisotropic conductive rubber is formed by embedding materials (metal wire etc.), which are conductive only in a direction of thickness, in an insulating material such as rubber.

I) The needle-type mechanical probe has the following demerits.

a) Since needles are formed one by one on an individual needle basis, a manufacture cost of the contactor is high.

b) Since needles are attached to a contactor substrate individually, there is a limit in accuracy of positioning of the needle tip.

c) When needles are inclined, there is a limit in arrangement of the needles, and, thus, it is difficult to make the contactor to simultaneously contact electrodes of a plurality of LSIs.

d) In the case of a coil spring type, the interval of adjacent coil-springs is very small when the coils springs are arranged at a small pitch, and, thus, it is difficult to manufacture a structure itself in which the coil springs are arranged and supported in one piece.

II) The membrane-type probe has the following demerits.

a) Each contact electrode cannot move freely. Each contact electrode is embedded into the insulating substrate, and the movable range each contact electrode is small. Moreover, each contact electrode is formed of a metal bump which has less flexibility. For this reason, if there is variation in the height of the bumps, there is a problem in that a low bump does not make a contact or causes insufficient contact may occur.

b) Since the bump forming each contact electrode is generally formed by accumulating metal plating layers, it takes a time for manufacturing the contactor and the manufacturing-cost is high.

III) The anisotropic conductive rubber has the following demerits.

a) A service life is short. Especially, when using at a high temperature, the contactor may be used only 20 to 30 times due to plastic deformation of a rubber part, and only once in the shortest case.

b) Since it is difficult to embed conductive materials into rubber at a small pitch, it cannot be applied to an LSI having electrodes of a small pitch. The pitch of the electrodes to which the anisotropic conductive rubber can be applied is about 150 μm.

Furthermore, since the total number of terminals of all LSIs on a single wafer may reach a few ten thousands in the contactor used for simultaneous wafer-level contact, there are following problems common to the above-mentioned types of contactors.

i) A surface of an LSI terminal (mainly an aluminum pad and a solder bump) is covered by an oxidization film. For this reason, it is desirable to perform a wiping operation, when the contactor makes a contact so as to remove the oxidization film. The wiping operation is an action to wipe a contact surface by sliding a contact tip of a contactor on the contact surface. Among the above-mentioned probes, the probes other than the cantilever-type probe basically deform in a vertical direction and cannot perform the wiping operation.

Moreover, since the terminal size is small, a distance of slide in the wiping operation is preferably as small as possible. Thus, it is necessary to find out the minimum wipe distance while maintaining a sufficient contact pressure. In order to attain this, it is necessary to develop a contactor which can control a contact pressure and a wipe distance separately.

ii) The pressure for pressing a contact electrode against the terminal of LSI is very large.

In the method of the above-mentioned conventional method, a pressure more than 0.1 N (about 10 g) per one terminal is needed, and, thus, when there are about hundred thousand terminals in an entire wafer, a pressure of about 10000 N (about 1000 kg) is needed. Since it is difficult to apply a pressure uniformly to whole terminals due to variation in the height of the contact electrodes, there may be a case in which an excessive pressure is applied to a specific terminal. Moreover, if there is no equipment which receives a total pressure, a wafer may break or bend, which may cause a damage of circuits on the chip.

iii) A position gap occurs due to a difference in thermal expansion coefficient. The LSI wafer is made from silicone in many cases, and the thermal expansion coefficient of silicon is about 3 ppm. However, since the insulating substrate of the above-mentioned contactor is formed of a resin or rubber material, the thermal expansion coefficient thereof is about 13-30 ppm. Therefore, although the contactor is accurately in contact with the LSI terminals at a normal temperature, the contact position of the contact electrodes may shift, when the contactor and the LSI are exposed to a high temperature such as in a BI test, due to a difference in the thermal expansion coefficient between the insulating substrate material and the silicon material of the wafer. Thus, there is a possibility that the contact electrode disengages from the LSI terminal or contacts an adjacent terminal. In a case in which polyimide is used for the insulating substrate material which has a thermal expansion coefficient of about 13 ppm, when a 8-inch wafer (a radius is about 100 mm) is used, if the wafer is heated up to 125 degrees C., a position shift of about 100 μn may occur in the terminal position near an outermost circumference of the wafer even when the contactor is accurately positioned at a normal temperature.

SUMMARY OF THE INVENTION

It is a general object of the present invention to provide an improved and useful contactor and a manufacturing method of the contactor in which the above-mentioned problems are eliminated.

A more specific object of the present invention is to provide a contactor having contact electrodes elastically deformable in a direction of thickness of the contactor even at a small pitch so that the contactor can make a contact with an object to be contacted with an appropriate contact pressure.

Another object of the present invention is to provide a contactor which can provided an appropriate wiping operation by the contact electrodes.

A further object of the present invention is to provide a contactor in which all contact electrodes can make a contact with respective terminals at a low pressure even if there is variation in the height of the contact electrodes.

In order to achieve the above-mentioned objects, there is provided according to the present invention a contactor configured to be arranged between a semiconductor device and a test board so as to electrically connect the semiconductor device to the test board, the contactor comprising: a plurality of contact electrodes each having a first contact electrode part, a second contact electrode part and a connecting part electrically connecting the first contact electrode part to the second contact electrode part, the first contact electrode part for contacting an electrode of said semiconductor device, the second contact electrode part for contacting a terminal of said test board; and a combining member having an insulating characteristic and holding the connecting part of each of the contact electrodes in a predetermined arrangement.

According to the above-mentioned invention, the middle portion of the electrode serves as the connecting part, which merely connects the first and second contact electrode parts with each other. Thus, the width of the connecting part can be reduced, since no mechanical strength is required for the connecting part. Accordingly, a plurality of contact electrodes can be arranged with a small pitch by supporting the electrodes by the combining member formed of an insulating material such as an insulating resin.

In the contactor according to the present invention, said first contact electrode part may have a first spring constant and said second contact electrode part may have a second spring constant different from the first spring constant. Accordingly, the contact pressure applied to the semiconductor device can be set separately from the contact pressure applied to the test board so that an appropriate contact pressure can be applied to each of the semiconductor device and the test board.

Additionally, said first contact electrode part may be movable or rotatable due to a deformation thereof while contacting the electrode of said semiconductor electrode when said first contact electrode part is pressed against the terminal of said semiconductor device and being deformed. Accordingly, if an oxidation film is formed on the electrode terminal, a good contact can be made by breaking the oxidation film, which provides a reliable contact by the contactor.

Additionally, the contactor according to the present invention may further comprise a pattern wiring formed on a surface of said combining member, the pattern wiring connected to the connecting part of said contact electrode. Accordingly, the first and second contact electrode parts can be connected by the pattern wiring and the via, which allows an electronic (electronic component) mounted on the combining member. The electronic part may be an LSI or a circuit element which assists a function of an electric circuit provided on the test board.

Additionally, there is provided according to another aspect of the present invention a manufacturing method of a contactor configured to be arranged between a semiconductor device and a test board so as to electrically connect the semiconductor device to the test board, the manufacturing method comprising the steps of: forming a via in a contactor board; and forming a first contact electrode part on one end of the via by a plating method, and forming a second contact electrode part on the other end of the via by a plating method.

According to the above-mentioned invention, the first and second contact electrode parts can be easily formed on the opposite sides of the contactor board using a plating method.

The manufacturing method according to the present invention may further comprises a step of deforming at least one of said first and second contact electrode parts. Accordingly, a desired spring constant can be provided to each of the first and second contact electrode parts by simply deforming the first and second contact electrode parts formed by a plating method.

Additionally, there is provided according to another aspect of the present invention a manufacturing method of a contactor configured to be arranged between a semiconductor device and a test board so as to electrically connect the semiconductor device to the test board, the manufacturing method comprising the steps of: forming a contact electrode part extending from a surface of a contactor board in a direction substantially perpendicular to the surface; engaging a through hole of a guide plate with a tip portion of the contact electrode part; and moving the guide plate in a direction substantially parallel to the surface of the contactor board so as to incline the contact electrode.

According to the above-mentioned invention, a plurality of contact electrodes can be inclined with a uniform angle by simply using the guide plate. Thus, the contact electrodes arranged at a small pitch can be inclined while maintaining a uniform distance between adjacent contact electrodes, which enables arrangement of the contact electrode at a smaller pitch.

Additionally, there is provided according to another aspect of the present invention a manufacturing method of a contactor configured to be arranged between a semiconductor device and a test board so as to electrically connect the semiconductor device to the test board, the manufacturing method comprising the steps of: forming a contact electrode part extending from a surface of a contactor board in a direction substantially perpendicular to the surface; engaging a through hole of a guide plate with a predetermined portion of the contact electrode part; and moving the guide plate in a direction substantially parallel to the surface of the contactor board so as to bend or deform the contact electrode part at or near the predetermined portion.

According to the above-mentioned invention, a plurality of contact electrodes can be formed in a uniform shape by simply using the guide plate.

Additionally, there is provided according to another aspect of the present invention a contactor configured to be arranged between a semiconductor device and a test board so as to contact the semiconductor device to the test board, the contactor comprising: a plate-like substrate formed of an insulating material, the substrate having a first surface facing said semiconductor device and a second surface facing said testing board; and a plurality of contact electrodes embedded and fixed in the substrate, wherein each of said contact electrodes has a first end portion, a second end portion and a conductive portion between the first end portion and second end portion, the first end portion protruding from a first surface of said substrate, the second end portion protruding from a second surface of said substrate, and said substrate and said conductive portion are deformable in a direction of a thickness of said substrate.

According to the above-mentioned invention, a contact pressure can be generated by the elastic deformation of the conductive part and the elastic deformation of the substrate. Thus, the contactor as a whole is capable of elastically deforming in the direction of thickness thereof with a small spring constant. Therefore, even if there is large deviation in the distance between the object to be contacted and the contact ends of the contact electrodes, the contact electrodes can be contacted with a small contact pressure to each of the contact electrodes. Additionally, the spring constant of the substrate can be easily changed by selecting the material of the substrate.

In contactor according to the present invention, a first coating layer may be formed on said first surface of said substrate, the first coating layer having a thermal expansion coefficient substantially equal to that of said substrate of said semiconductor device, and a first end portion of said contactor electrode may protrude from said first coating layer.

Accordingly, the a displacement of the first end of the contact electrode protruding from the first covering layer due to thermal expansion can be equalized with a displacement of the electrode terminal of the semiconductor device due to thermal expansion. Thus, a position offset of the contact electrode with respect to the terminal of the semiconductor device due to thermal expansion can be prevented.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according the present invention.

Figure 1:
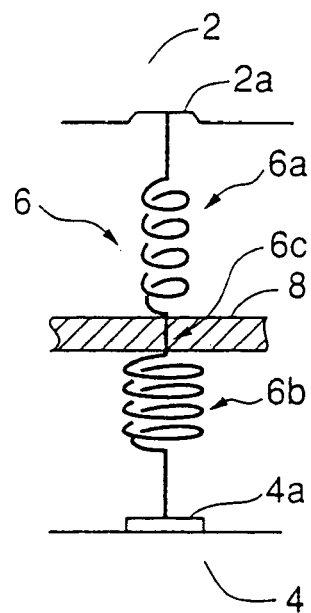
FIG. 1 is an illustration of a basic concept of a contactor according to a first embodiment of the present invention.

FIG. 1 is an illustration for explaining the principle of a first embodiment of the present invention. As shown in FIG. 1, a contactor according to the first embodiment of the present invention electrically connects electrode terminals 2a of an LSI 2, which is an object to be contacted, to terminals 4a of a test board 4. The contactor has a plurality of contact electrodes 6. Each of the contact electrodes 6 is arranged between corresponding electrode terminal 2a and terminal 4a so as to electrically connect these parts.

Each of the contact electrodes 6 has an LSI-side contact electrode part 6a (first contact electrode part) and a test-board-side contact electrode part 6b (second contact electrode part). The LSI-side contact electrode part 6a and the test-board-side contact electrode part 6b are mutually connected electrically by a connecting part 6c. An end of the LSI-side contact electrode part 6a on the side opposite to the connecting part 6 is configured to be brought into contact with the electrode terminal 2a of the LSI 2, and an end of the test-board-side contact electrode part 6b on the side opposite to the connecting part 6 is configured to be brought into contact with the terminal 4a of the test board 4.

The LSI-side contact electrode part 6a has a predetermined spring constant (first spring constant), and is adjusted so that a contact pressure to the electrode terminal 2a of the LSI 2 becomes an appropriate value. On the other hand, the test-board side contact electrode part 6b has a spring constant (second spring constant) different from the first spring constant, and is adjusted so that a contact pressure to the terminal 4a of the test board 4 becomes an appropriate value.

Therefore, the contactor 6 can contact both the electrode terminal 2a of LSI 2 and the terminal 4a of the test board 4 with different contact pressures. That is, the contact pressure to the electrode terminal 2a of the LSI 2 and the contact pressure to the terminal 4a of the test board 4 are separately set up by differentiating the first spring constant of the LSI-side contact electrode part 6a from the second spring constant of the test-board-side contact electrode part 6b.

Figure 2:
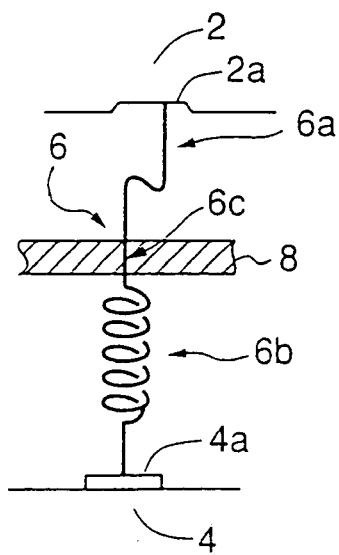
FIG. 2 is an illustration of the contactor using a bent spring as an LSI-side contact electrode.

It should be noted that, in the contact electrode 6 shown in FIG. 1, although both the LSI-side contact electrode part 6a and the test-board-side contact electrode part 6b are coil springs, the LSI-side contact electrode part 6a may be formed of a bent spring as shown in FIG. 2. Moreover, both the LSI-side contact electrode part 6a and the test-board-side contact electrode part 6b may be bent springs.

Here, in a case in which a coil spring is compressed, an end of the coil spring is twisted, which generates a rotational movement of the end of the coil spring. Such a rotational movement of the end of the coil spring can be used for removal of an oxidization film. That is, by forming the LSI-side contact electrode part 6a and the test-board-side contact-electrode-part 6b as coil springs, the contacting ends are rotated, when the LSI-side contact electrode part 6a and the test-board-side contact electrode part 6b contact the electrode terminal 2a of the LSI2 and the terminal 4a of the test board 4, respectively, and, thus, an effect of breaking an oxidization film formed on the electrode terminal 2a of the LSI2 and the terminal 4a of the test board 4 can be acquired.

Moreover, in a case in which a bent spring is used as the contact electrode 6 as shown in FIG. 2, a movement is generated at an end of the bent spring in a direction substantially perpendicular to a direction of compression. Therefore, by forming the LSI-side contact electrode part 6a and the test-board-side contact electrode part 6b as bent springs, the contacting ends are slid (moved along the surface), when the LSI-side contact electrode part 6a and the test-board-side contact electrode part 6b contact the electrode terminal 2a of the LSI2 and the terminal 4a of the test board 4, respectively, and, thus, an effect of breaking an oxidization film formed on the electrode terminal 2a of the LSI2 and the terminal 4a of the test board 4 can be acquired.

It should be noted that the connecting part 6c of the contact electrode 6 is fixed to a contactor substrate 8. That is, the LSI-side contact electrode part 6a is compressed between the contactor substrate 8 and the LSI 2, and the test-board-side contact electrode part 6b is compressed between the contactor substrate 8 and the test board 4. Therefore, when the contactor substrate 8 is fixedly supported, a contact pressure based on only the spring constant of the LSI-side contact electrode part 6a acts on the electrode terminal 2a of the LSI 2, and a contact pressure base on only the spring constant of the test-board-side contact electrode part 6*b* acts on the terminal 4*a* of the test board 4. Therefore, for example, the contact pressure to the electrode terminal 2*a* of the LSI 2 can be set to 0.15 N (about 15 g), and the contact pressure to the terminal 4*a* of the test board 4 can be set to 0.02-0.05 N (about 3-5 g).

A description will now be given of embodiments of the contactor according to the above-mentioned embodiment.

Figures 3A, 3B, 3C:
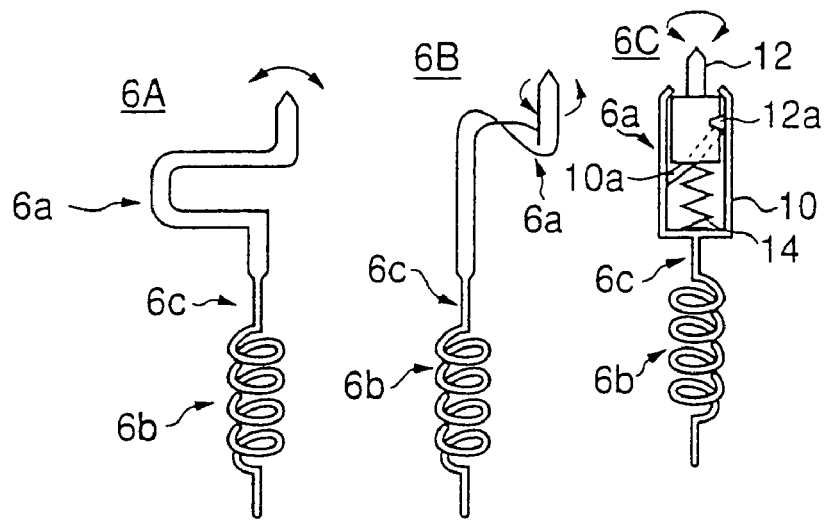
FIGS. 3A through 3C are illustrations of variations of each contact electrode.

FIGS. 3A, 3B and 3C show examples in which a coil spring is used for the test-board-side contact electrode part 6*b* and a spring other than a coil spring is used for the LSI-side contact electrode part 6*a*.

FIG. 3A shows a contact electrode 6A using a spring bent in a U-shape as the LSI-side contact electrode part 6*a*. The test-board-side contact electrode part 6*b* is a coil spring, which does not slide when being brought into contact with the terminal 4*a*. On the other hand, since the LSI-side contact electrode part 6*a* is constituted by the U-shaped spring, the LSI-side contact electrode part 6*a* provides an operation to break an oxidation film of the electrode terminal 2*a* of the LSI 2 when being brought into contact with the electrode terminal 2*a* of the LSI 2. In the contact electrode 6A according to the present embodiment, the LSI-side contact electrode part 6*a*, the test-board-side contact electrode part 6*b* and the connecting part 6*c* may be integrally formed with each other by a copper plate or the like, and may be formed as separate parts and connected to each other by an appropriate method.

The reason for constituting only the LSI-side contact electrode part 6*a* to slide is as follows. That is, the terminal 4*a* of the test board 4 is provided with gold plating in many cases, which can attain good contact easily. Moreover, since a contactor is used in many cases as it is without removing once it is attached to a test board, the contactor can maintain a state where it contact first with the test board 4. On the other hand, the electrode terminal 2*a* of the LSI 2 is formed in many cases with aluminum or solder, which results in formation of a natural oxidization film on the surface of the electrode terminal 2*a*. Moreover, the electrode terminal of the LSI is brought into contact with the. LSI-side contact electrode part 6*a*, and there is a large possibility that dirt adheres onto the contact end of the LSI-side contact electrode part 6*a*.

FIG. 3B shows a contact electrode 6B using a bent spring further twisted is used as the LSI-side contact electrode part 6*a*. When the LSI-side contact electrode part 6*a* is pressed against the electrode terminal 2*a* of the LSI 2 in the case where the bent spring is further twisted, the contact terminal of the LSI-side contact electrode part 6*a* slides while rotating as shown in an arrow in the figure, thereby further improving the effect of breaking an oxidation film. It should be noted that portions other than the LSI-side contact electrode part 6*a* of the contactor 6B are the same as that of the contactor 6A shown in FIG. 3A, and a description thereof will be omitted.

FIG. 3C shows a contact electrode 6C using a pin energized by a spring as the LSI-side contact electrode part 6*a*. The LSI-side contact electrode part 6*a* has a composition in which a pin 12 and a spring 14 are accommodated in a cylindrical container 10. A tip of the pin 12 is projected from the container 10 and contacts the electrode terminal 2*a* of the LSI 2. Moreover, the pin 12 is energized by the spring 14 and is able to press the pin 12 against the electrode terminal 2*a* with an appropriate pressure. Here, a projection 12*a* is provided on a side of the pin 12, and the projection 12*a* is inserted into a groove (slot) 10*a* spirally formed on the sidewall of the container 10. Therefore, the pin 12 is pressed against the electrode terminal 2*a* while being rotated. Although the pin 12 does not slide, the pin 12 can break an oxidization film of the electrode terminal 2*a*, thereby positively contacting the electrode terminal 2*a* of the LSI 2. It should be noted that portions other than the LSI-side contact electrode part 6*a* of the contactor 6C are the same as that of the contactor 6A shown in FIG. 3A, and a description thereof will be omitted.

Figures 4A, 4B, 4C:
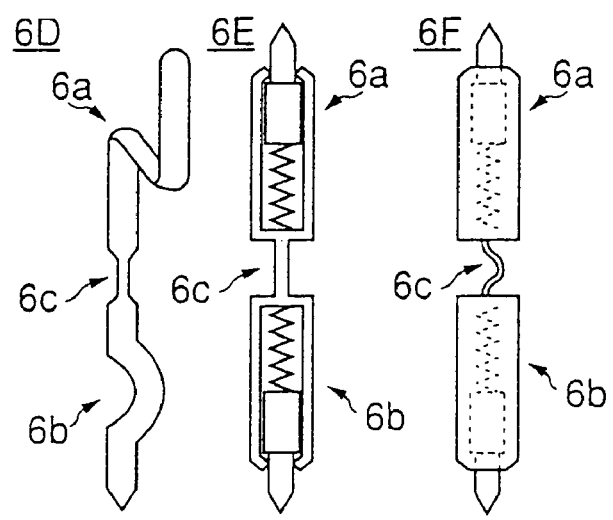
FIGS. 4A through 4C are illustrations of variations of each contact electrode.

FIGS. 4A, 4B and 4C show examples of the contact electrode in which a shape of a material of the connecting part 6*c* is different from that of the LSI-side contact electrode part 6*a* and the test-board-side contact electrode part 6*b*.

FIG. 4A shows a contact electrode 6D having the connecting part 6*c* having a reduced width by constituting the LSI-side contact electrode part 6*a* and the test-board-side contact electrode part 6*b* by bent springs. The contact electrode 6D is formed of a belt-like metal plate. The LSI-side contact electrode part 6*a* is bent in a direction perpendicular to a surface of the belt-like metal plate, and the test-board-side contact electrode part 6*b* is bent in a direction parallel to the surface of the belt-like metal plate. The connecting part 6*c* has a width smaller than the widths of the LSI-side contact electrode part 6*a* and the test-board-side contact electrode part 6*b*. Thus, a fixed portion of the contact electrode on the contactor substrate 8 can be enlarged by reducing the size of the connecting part 6*c*, which is fixed by the contactor substrate 8. That is, an interval between connecting parts of adjacent contact electrodes 6D can be increased. Thereby, the manufacture of the contactor becomes easy and the contact electrodes can be by efficiently arranged with a small pitch.

FIG. 4B shows a contact electrode 6E having the connecting part 6*c* with a reduced width by constituting each of the LSI-side contact electrode part 6*a* and the test-board-side contact electrode part 6*b* as a pin energized by a spring as shown in FIG. 3C. Although not shown in FIG. 4B, in the LSI side contact electrode part, it is preferable to provide a projection to the pin and rotate the pin as shown in FIG. 3C.

Also in the contact electrode 6E, since the connecting part 6*c* has a width smaller than the widths of the LSI-side contact electrode part 6*a* and the test-board-side contact electrode part 6*b*, an interval between the connecting parts of adjacent contact electrodes 6E, which are fixed to the contactor substrate 8, can be increased. Thereby, the manufacture of the contactor becomes easy, and the contact electrodes can be arranged with a small pitch.

FIG. 4C shows a contact electrode 6F having the connecting part 6*c* formed of a metal wire by constituting each of the LSI-side contact electrode part 6*a* and the test-board-side contact electrode part 6*b* as a pin energized by a spring as shown in FIG. 3C. Although not shown in FIG. 4C, in the LSI side contact electrode part 6*a*, it is preferable to provide a projection to the pin and rotate the pin as shown in FIG. 3C.

Also in the contact electrode 6F, since the connecting part 6*c* has a width smaller than the widths of the LSI-side contact electrode part 6*a* and the test-board-side contact electrode part 6*b*, an interval between the connecting parts of adjacent contact electrodes 6E, which are fixed to the contactor substrate, can be increased. Thereby, the manufacture of the contactor becomes easy, and the contact electrodes can be arranged with a small pitch.

Figure 5:
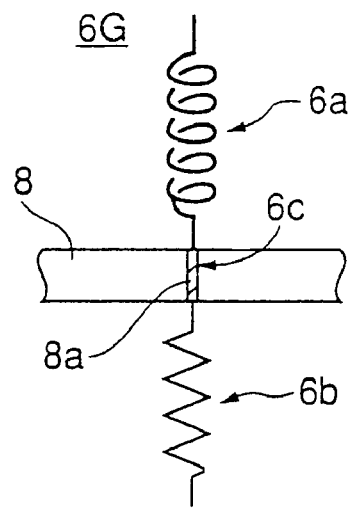
FIG. 5 is an illustration of a contact electrode having an LSI-side contact electrode and a test-board-side contact electrode connected by a via of a contactor board.

FIG. 5 shows a contact electrode 6G in which the LSI-side contact electrode part 6*a* and the test-board-side contact electrode part 6*b* are formed separately and connected by a via 8*a* of the contactor substrate 8. In the example shown in FIG. 5, each of the LSI-side contact electrode part 6*a* and the test-board-side contact electrode part 6*b* are a coil spring, and are electrically connected by the via 8*a* of the contactor substrate 8. Thus, each contact electrode 6G is not necessarily formed as an integrated part connected by a connecting part, and the LSI-side contact electrode part 6a and the test-board-side contact electrode part 6b may be connected via the contactor substrate 8 (the via 8a).

Figure 6A:
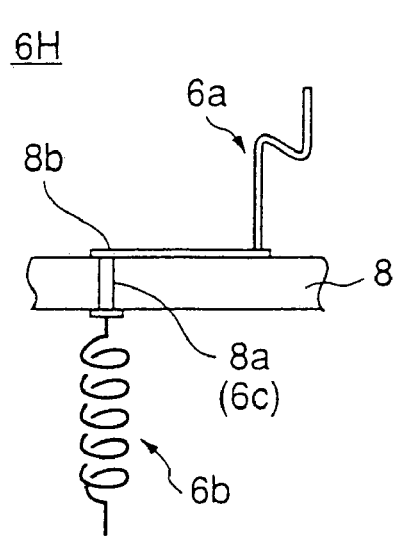
FIGS. 6A and 6B are illustrations of contactors having an LSI-side contact electrode and a test-board contact electrode having different at different positions.
Figure 6B:
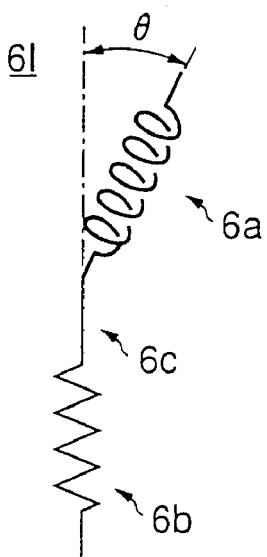

FIGS. 6A and 6B show contactors which can locate the LSI-side contact electrode part 6a and the test-board-side contact electrode part 6b in different positions.

The contact electrode 6H shown in FIG. 6A has the LSI-side contact electrode part 6a and the test-board-side contact electrode part 6b located in different positions by a pattern wiring 8b formed on the contactor substrate 8. Thus, the LSI-side contact electrode part 6a and the test-board-side contact electrode part 6b can be arranged in arbitrary positions by the pattern wiring 8c formed on the contactor substrate 8. Moreover, for example, a plurality of LSI-side contact electrode parts 6a may be provided to a single test-board-side contact electrode part 6b. Therefore, the flexibility of a design of the contactor is improved.

The contact electrode 6I shown in FIG. 6B has the LSI-side contact electrode part 6a having a longitudinal axis being inclined from a longitudinal axis of the test-board-side contact electrode part 6b. The contact electrode 6I comprises the LSI-side contact electrode part 6a and the test-board-side contact electrode part 6b, each of which are formed by a spring, and integrally formed with the connecting part 6c. The LSI-side contact electrode part 6a inclines an angle θ at the connecting part 6c. Accordingly, the contact end of the LSI-side contact electrode part 6a is located in a position shifted by a distance corresponding to the angle θ from the contact end of the test-board-side contact electrode part 6b.

Figure 7:
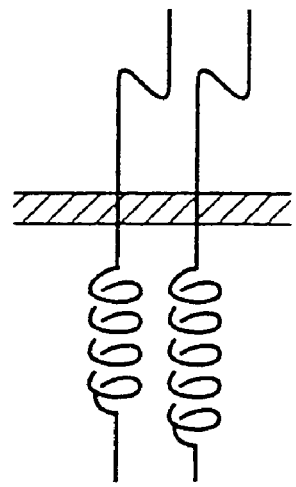
FIG. 7 is an illustration of a contactor having a plurality of contact electrodes having connection parts between which a resin is filled to form a contactor board.

FIG. 7 illustrates an example in which a plurality of contact electrodes are arranged and a resin is filled between the connecting parts 6c so as to form a contactor substrate. Since a sufficient space can be maintained between the connecting parts of adjacent contact electrode due to a small width of each connecting part 6c, a resin, which is an insulating material, can be filled in the space. Therefore, a plurality of contact electrodes can be arranged and easily fixed by the insulating resin with a small pitch.

Although the contact electrode parts of the conventional contact electrodes are conventionally fixed by a resin, it is difficult to maintain a space for providing the resin if the width of the contact electrode part is large and the pitch of the arranged contact electrodes is small. However, if the connecting part is provided to the contact electrode as in the present invention, the width of the connecting part can be reduced since only the electrical connection is required for the connecting part, thereby acquiring a sufficient space for filling the resin.

Figures 8A, 8B:
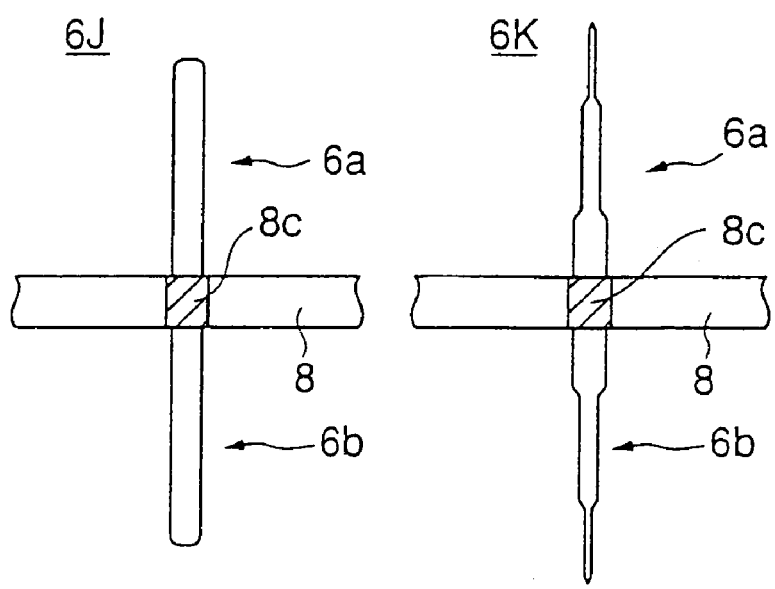
FIGS. 8A and 8B are illustrations of basic structures of a contactor according to a second embodiment of the present invention.

FIGS. 8A and 8B show a basic structures of a contact electrode according to a second embodiment of the present invention. FIG. 8A shows a contact electrode 6J in which the LSI-side contact electrode part 6a and the test-board-side contact electrode part 6b are protrudingly formed from a conductive part 8c of the contactor substrate 8. In order to manufacture the contact electrode 6J, the conductive part 8c extending though the contactor substrate 8 is formed first. Then, a part serving as the LSI-side contact electrode part 6a is formed on one side of the conductive part 8c by copper plating or the like, and a part serving as the test-board-side contact electrode part 6b is formed on the opposite side of the conductive part 8c by copper plating or the like. Here, the conductive part 8c corresponds to the connecting part 6c.

In the contact electrode 6J shown in FIG. 8A, since growth formation is carried out by the plating method so as to form the LSI-side contact electrode part 6a and the test-board-side contact electrode part 6b, the LSI-side contact electrode part 6a and the test-board-side contact electrode part 6b extend in the direction perpendicular to the surface of the contactor substrate 8. However, the LSI-side contact electrode part 6a and the test-board-side contact electrode part 6b can be bent by a pressing force so as to acquire an appropriate contact pressure.

Moreover, as a contact electrode 6K shown in FIG. 8B, a composition which is easy to be bent can be achieved by reducing the diameter or width of the contact electrodes 6a and 6b toward an extreme end thereof. By changing the diameter or width of the contact electrode parts between the LSI-side and test-board-side electrode parts, the contact electrode parts of different spring constants can be formed easily. Moreover, the contact electrode parts having different spring constants can be formed also by changing the material of the contact electrode parts between the LSI-side and the test-board-side electrode parts.

Figure 9A:
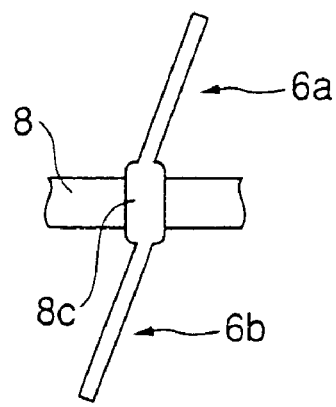
FIGS. 9A, 9B and 9C are illustrations of variations of the contactor shown in FIGS. 8A and 8B.
Figure 9B:
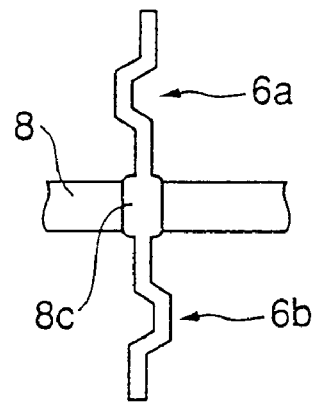
Figure 9C:
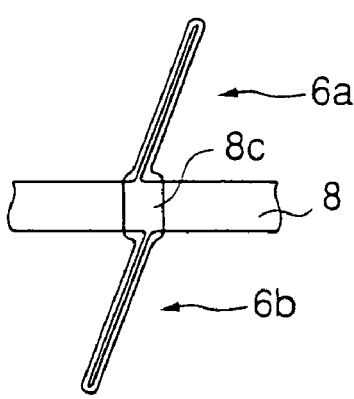

FIGS. 9A, 9B and 9C show variations of the contact electrodes shown in FIGS. 8A and 8B.

The contact electrode shown in FIG. 9A is an example in which the LSI-side contact electrode part 6a and the test-board-side contact electrode part 6b are inclined so as to be easily bent. In this variation, the effect of breaking an oxidization film by a slide of the contact end can also be acquired by inclining the contact electrode part.

The contact electrode shown in FIG. 9B is an example in which the LSI-side contact electrode part 6a and the test-board-side contact electrode part 6b are deformed in a hook-like shape so as to be easily bent. Thus, the spring constant of the contact electrode part can be varied by changing the form of the contact electrode part.

The contact electrode shown in FIG. 9C is an example in which plating or coating is applied to a surface of the contact electrode. For example, when the LSI-side contact electrode part 6a and the test-board-side contact electrode part 6b are formed by copper plating, the elasticity of the contact electrode part can be increased by applying nickel plating. Moreover, gold plating may be applied in order to decrease a contact resistance. Plating or coating is not always required for both the LSI-side contact electrode part 6a and the test-board-side contact electrode part 6b, and may be applied to only one of the LSI-side contact electrode part 6a and the test-board-side contact electrode part 6b.

Figure 10A:
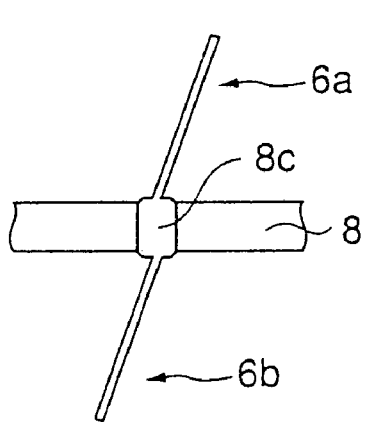
FIGS. 10A and 10B are illustrations of contact electrodes having contactor boards formed of a material having the same thermal expansion rate with LSI substrates.
Figure 10B:
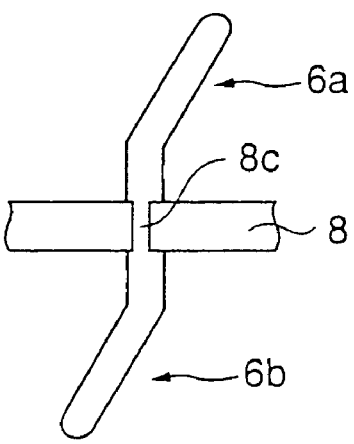

The contact electrodes shown in FIGS. 10A and 10B have basically the same structure as the contact electrode shown in FIG. 9A except for the contactor substrate 8 being formed of a different material. That is, the contactor substrate 8 to which the contact electrodes shown in FIGS. 10A and 10B are fixed is formed of a material having almost the same heat expansion coefficient as silicon which is a material of the substrate of the LSI.

Specifically, silicon or ceramics can be used as a material of the contactor substrate. By forming the contactor substrate 8 by the material having almost the same heat expansion coefficient as silicon, the heat expansion of the contactor and the LSI become equal to each other when the LSI connected to the test board via the contactor is heated, which prevents the contact end of each contact electrode from being displaced.

Figure 11:
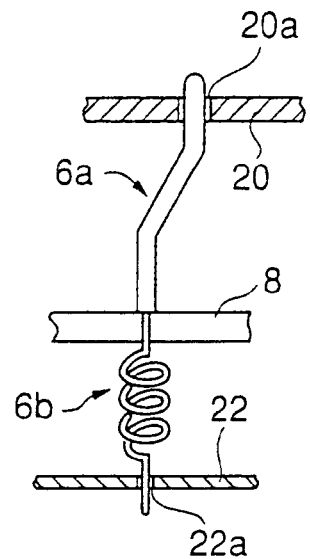
FIG. 11 is an illustration of a contactor according to a third embodiment of the present invention.

A description will now be given of a third embodiment of the present invention. FIG. 11 shows a contactor according to the third embodiment of the present invention. In the contact electrode shown in FIG. 11, the LSI-side contact electrode part 6a is formed of a bent spring, and the test-board-side contact electrode part 6b is formed of a coil spring. In the present embodiment, a guide plate is provided on each of the LSI side and the test-board side of the contactor, the guide plate having through holes engaging with tip portions of the LSI-side contact electrode part 6a and the test-board-side contact electrode part 6b, respectively.

Namely, the tip portion of each LSI-side contact electrode part 6a is inserted into the though hole 20a formed in the LSI-side guide plate (first guide plate), and only the contact end protrudes from the guide plate toward the LSI. Similarly, the tip portion of each test-board-side contact electrode part 6b is inserted into the though hole 22a formed in the test-board-side guide plate (second guide plate), and only the contact end protrudes from the guide plate toward the test board.

As mentioned above, the tip portions of the LSI-side contact electrode part 6a and the test-board-side contact electrode part 6b can be accurately positioned by providing the LSI-side guide plate 20 and the test-board-side guide plate 22 so as to guide the tip portions of the LSI-side contact electrode part 6a and the test-board-side contact electrode part 6b. Therefore, even if there is variation in positions of the tip portions of the LSI-side contact electrode part 6a and the test-board-side contact electrode part 6b due to variation in shapes occurring during the manufacturing process of the LSI-side contact electrode part 6a and the test-board-side contact electrode part 6b, the tip portions can be located in accurate positions by the LSI-side guide plate 20 and the test-board-side guide plate 22.

Figure 12:
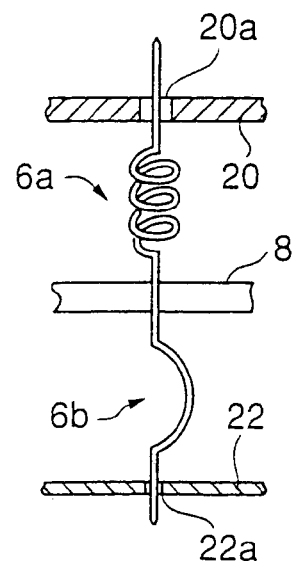
FIG. 12 is an illustration of a contactor shown in FIG. 11 having a guide plate formed of a different material.

FIG. 12 shows an example in which the guide plates shown in FIG. 12 are formed of predetermined materials. The LSI-side guide plate 20 shown in FIG. 12 is formed of the same material as a substrate of the LSI, which is an object to be contacted. For example, in a case where the LSI is formed from a silicon wafer, the LSI-side guide plate 20 is also formed from a silicon wafer and provided with through holes 20a. Thereby, even if the contactor substrate 8 differs from the LSI in the thermal expansion rate, the tip portion of the LSI-side contact electrode part 6a can be prevented from being displaced due to the difference in the thermal expansion rate. That is, since the LSI and the LSI-side guide plate 20 have the same thermal expansion rate, the tip portion of the LSI-side contact electrode part 6a is moved by a distance of the corresponding electrode terminal of the LSI when the LSI and the contactor are heated at the same temperature. Thereby, the relative position of the tip portion of the LSI-side contact electrode part 6a with respect to the corresponding electrode terminal of the LSI does not change, which prevents displacement of position of the contact end.

It should be noted that although it is preferable to form the LSI-side guide plate 20 by the same material as the LSI, the effect of prevention of displacement caused by the thermal expansion can be acquired by forming the LSI-side guide plate 20 by a ceramic board having a thermal expansion rate nearly equal to the thermal expansion rate of the LSI material.

Similar to the LSI-side guide plate 20, the test-board-side guide plate 22 is formed of the same material as the material of the test board, which is an object to be contacted. For example, when the test board is formed of a glass epoxy material, the test-board-side guide plate 22 may be formed of a substrate formed of the same glass epoxy material and provided with the though holes 22a. Thereby, even if the heat expansion coefficients of the test board and the contactor substrate 8 differ from each other, a position shift of the tip portion of the LSI-side contact electrode part 6a can be prevented. That is, since the test board and the test-board-side guide plate 22 have the same thermal expansion rate, the tip portion of the test-board-side contact electrode part 6b is moved by a distance of the corresponding terminal of the test board when the test board and the contactor are heated at the same temperature. Thereby, the relative position of the tip portion of the test-board-side contact electrode part 6b with respect to the corresponding terminal of the test board does not change, which prevents the displacement of the contact end.

It should be noted that the contact electrode shown in FIG. 12 has the LSI-side contact electrode part 6a formed of a coil spring. This is for absorbing a deformation of the LSI-side contact electrode part 6a caused by a large displacement of the tip portion of the LSI-side contact electrode part 6a due to the thermal expansion of the LSI-side guide plate 20.

Moreover, in the example shown in FIG. 12, if the contactor substrate 8 is formed of the same material as the test board, there is no need to provide the test-board side guide plate 22, and only the LSI-side guide plate 20 be provided.

Figure 13:
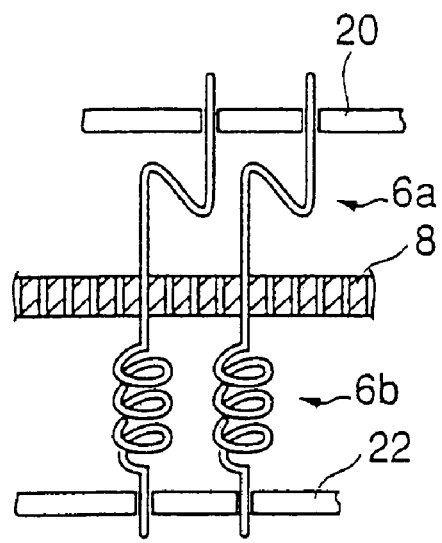
FIG. 13 is an illustration of a contactor having a contactor board with a small rigidity in a horizontal direction.

FIG. 13 shows an example in which a rigidity of the contactor substrate 8 in a horizontal direction is reduced in the example provided with the guide plates 20 and 22. That is, the contactor substrate 8 is made easy to be deformed so as to reduce deformation of the LSI-side contact electrode part 6a and the test-board-side contact electrode part 6b due to thermal expansion. In order to make the contactor substrate 8 easy to be deformed in a horizontal direction, there is a method in which a number of pores or slits are provided to the contact electrode substrate 8 so as change the substrate to a mesh-like form as shown in FIG. 13.

Figures 14A, 14B:
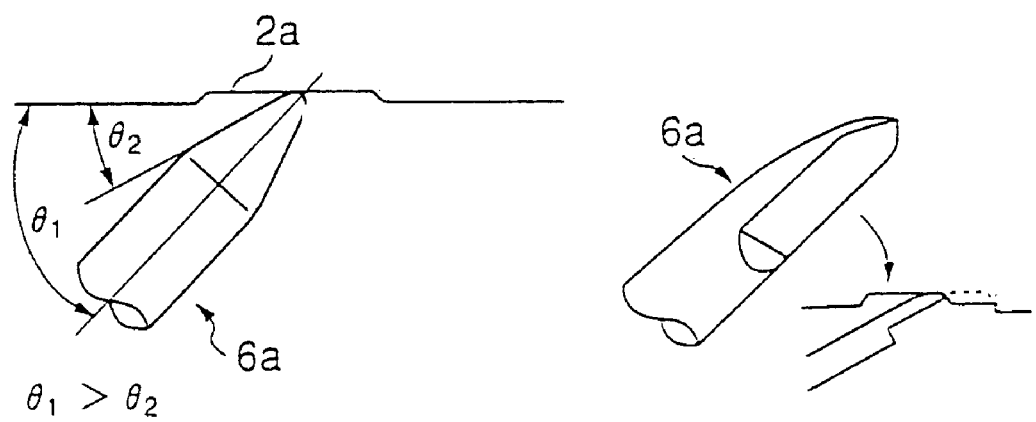
FIGS. 14A and 14B are illustration of tips of contact electrodes.

In each of the above-mentioned embodiments, it is preferable that the tip portions of the LSI-side contact electrode part 6a and the test-board-side contact electrode part 6b are tapered as shown in FIG. 14A, or formed in a ship-bottom shape as shown in FIG. 14B. Thereby, when a force is applied to the contact end in a traverse direction, the contact end moves with appropriate friction, which removes an oxidization film and achieves a reliable contact.

Figure 15:
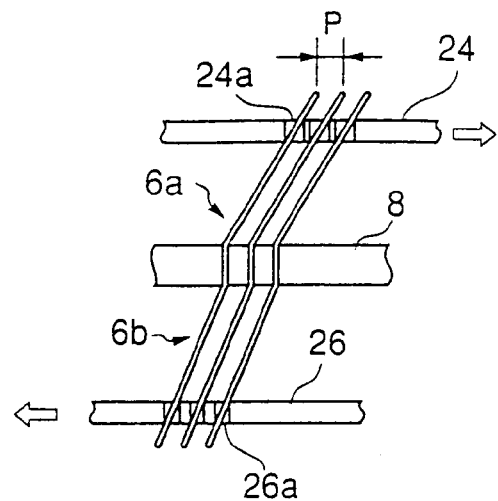
FIG. 15 is an illustration for explaining a method of providing inclination to a contact electrode.

FIG. 15 is an illustration for explaining a method of providing an angle between the LSI-side contact electrode part 6a and the test-board-side contact electrode part 6b. In the method shown in FIG. 15, an inclination is provided to the contact electrode having the vertically extending LSI-side contact electrode 6a and test-board-side contact electrode 6b. According to the method shown in FIG. 15, a plurality of contact electrodes can be inclined simultaneously.

That is, an LSI-side guide plate 24 for inclination having the same structure as the LSI-side guide plate 20 is located near the tip portions of the LSI-side contact electrode parts 6a. More specifically, the LSI-side guide plate 24 is moved in a transverse direction by a predetermined distance after the LSI-side guide plate 24 is located so that the tip portion of each LSI-side contact electrode part 6a is inserted into a respective through hole 24a formed in the LSI-side guide plate 24. Thereby, the LSI-side contact electrode part 6a of each contact electrode is bent at a root thereof and being inclined.

Similarly, a test-board-side guide plate 26 for inclination having the same structure as the test-board-side guide plate 22 shown in FIG. 11 is located hear tip portions of the test-board-side contact electrode part 6b. More specifically, the test-board-side guide plate 26 is moved in a transverse direction by a predetermined distance after the test-board-side guide plate 26 is located so that the tip portion of each test-board-side contact electrode part 6b is inserted into a respective through hole 26a formed in the test-board-side guide plate 26. Thereby, the test-board-side contact electrode part 6b of each contact electrode is bent at a root thereof and being inclined.

The contact electrode to which the inclination is provided as mentioned above is able to reduce the pitch P of the adjacent LSI-side contact electrode parts 6a, which allows use of the contactor for an LSI having electrode arranged at a small pitch. Thus, the contact ends of the contact electrodes can be arranged with a small pitch since a plurality of LSI-side contact electrode parts 6a are simultaneously bent by the LSI-side guide plate 24. That is, although there is a possibility that adjacent LSI-side contact electrodes 6a contact with each other when the LSI-side contact electrodes 6a are bent on an individual electrode basis, all of the LSI-side contact electrode parts 6a are uniformly bent, which maintains a small pitch P of the LSI-side contact electrode parts 6a.

Figure 16:
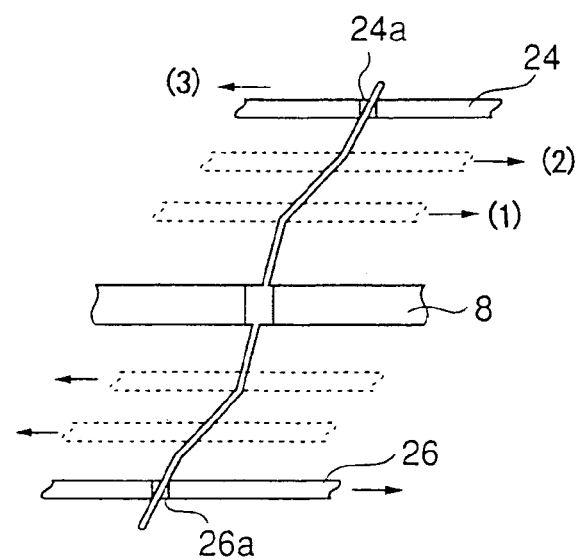
FIG. 16 is an illustration for explaining a method of bending a contact electrode at a plurality of positions by using the method shown in FIG. 16.

FIG. 16 is an illustration for explaining a method of bending the contact electrode at a plurality of points by using the method shown in FIG. 15. In FIG. 16, the LSI-side contact electrode part 6a is bent at three points by the LSI-side guide plate 24 for inclination. That is, first, the LSI-side guide plate 24 is engaged with a portion of the LSI-side guide plate 24 near the root thereof, and is moved in a transverse direction so as to provide a predetermined inclination ((1) of FIG. 16). Then, after the LSI-side guide plate 24 is moved upward, the LSI-side guide plate 24 is moved in the transverse direction so as to form a further inclined portion in the LSI-side contact electrode part 6a ((2) of FIG. 16). Then, after the LSI-side guide plate 24 is moved upward further, the LSI-side guide plate 24 is moved in a transverse direction opposite to that indicated by (2) so as to form an inclined portion having a reduced inclination ((3) of FIG. 16).

The contactor, which is bent and inclined at a plurality of points, can be easily formed by providing thinner parts or parts having smaller width than other parts of the LSI-side contact electrode part 6a at portions to be bent beforehand.

It should be noted that an inclination can be provided to the test-board-side contact electrode part 6b by the same method as that provides an inclination to the LSI-side contact electrode part 6a, and a description thereof will be omitted. Additionally, there is no need to form the LSI-side contact electrode in the same form with the test-board-side contact electrode part 6b, and the angle of inclination and the number of bent points may be varied.

Figure 17:
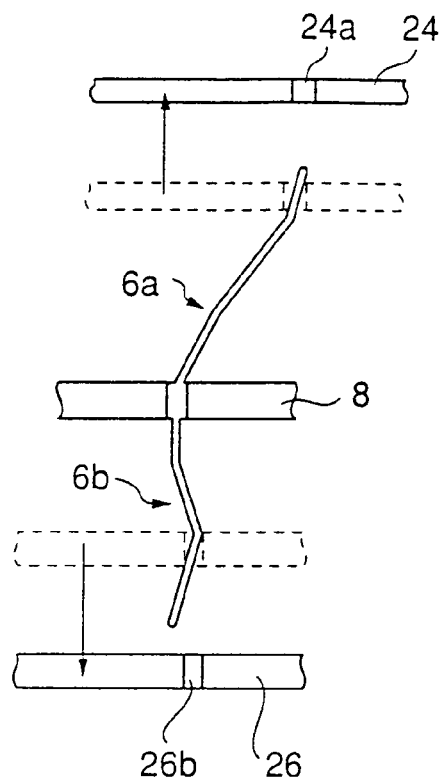
FIG. 17 is an illustration showing a removal of a guide plate after bending of the contact electrode is ended.

Moreover, in a case in which the method of bending the contact electrode using the guide plates 24 and 26 for inclination as mentioned above is used, although the guide plates 24 and 26 can remain as parts of the contactor, the guide plates 24 and 26 for an inclination may be removed as shown in FIG. 17 after the bending formation of the contact electrode is completed.

Figure 18:
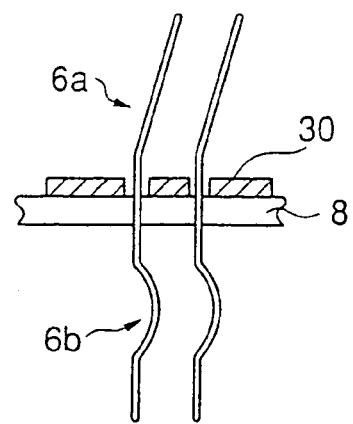
FIG. 18 is an illustration for explaining a contactor according to a fourth embodiment of the present invention.

FIG. 18 is an illustration for explaining a contactor according to a fourth embodiment of the present invention. The contactor according to the fourth embodiment of the present invention comprises a heater 30 provided to the contactor substrate 8. The contactor substrate is subjected to thermal expansion by heating the heater 30 after the LSI-side contact electrode 6a is pressed against the electrode terminal of the LSI. Thereby, the LSI-side contact electrode part 6a is moved slightly so as to achieve a good electric contact. That is, a wiping effect is acquired by using positively a displacement of the contact end due to the thermal expansion.

FIG. 19 is an illustration for explaining a contactor according to a fifth embodiment of the present invention. The contactor according to the fifth embodiment of the present invention provides an appropriate contact pressure or a wiping effect by causing the contact electrode itself deformed by heat.

Figure 19A:
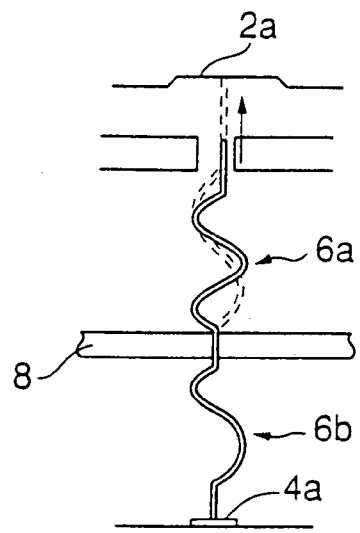
FIGS. 19A and 19B are illustrations for explaining a contactor according to a fifth embodiment of the present invention.
Figure 19B:
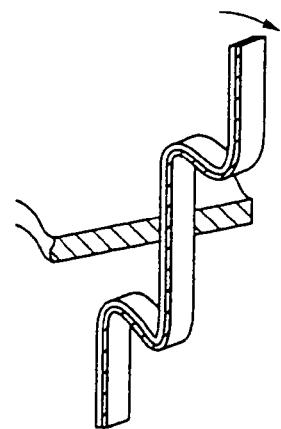

In the example shown in FIG. 19A, the LSI-side contact electrode part 6a is formed of a shape-memory alloy so that the LSI-side contact electrode part 6a is pressed against the electrode terminal 2a of the LSI by deformation of the LSI-side contact electrode part 6a by heating. That is, although the LSI-side contact electrode part 6a formed of a shape-memory alloy has a height which does not reach the electrode terminal of the LSI at a room temperature, the LSI-side contact electrode deforms to elongate in a longitudinal direction when heated at about 70° C. by a heater or the like, which causes the end of the LSI-side contact electrode part 6a contact the electrode terminal 2a of the LSI.

It should be noted that the test-board-side contact electrode part 6b may also be formed of a shape-memory alloy.

Moreover, each of the LSI-side contact electrode part 6a and the test-board-side contact electrode part 6b may be a coil spring formed of a shape-memory alloy. In the example shown in FIG. 19B, the contact electrode itself is formed of a bimetal so that the LSI-side contact electrode part 6a is deformed by heating or cooling, which presses an end of the LSI-side contact electrode part 6a against the electrode terminal 2a of the LSI while performing a wiping operation. When a bimetal is used, since the deformation of the bimetal is reversible, a contact pressure generated by heating the bimetal can be cancelled by cooling. In order to perform such alternate heating and cooling, it is preferable to provide an electronic cooling element such as a Peltier element to the contactor substrate 8.

Figure 20:
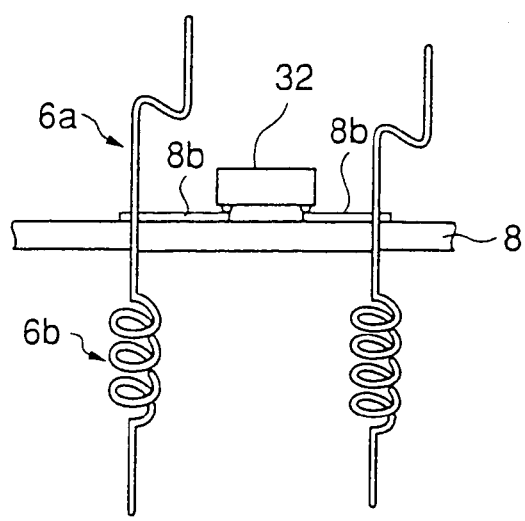
FIG. 20 is an illustration of a contactor on which an electronic part is provided.

FIG. 20 shows an example in which an LSI or electronic part is provided to the contactor itself by using the contactor according to the above-mentioned embodiments. That is, a pattern wiring 8b is formed on a surface of the contactor substrate 8 so as to connect the pattern wiring 8b to a desired contact electrode, and a terminal for connecting an LSI or electronic part 32 is formed in the pattern wiring 8b. In the example shown in FIG. 20, the LSI 32 for assisting a test function is electrically connected to a predetermined contact electrode via the pattern wiring 8b.

Figure 21:
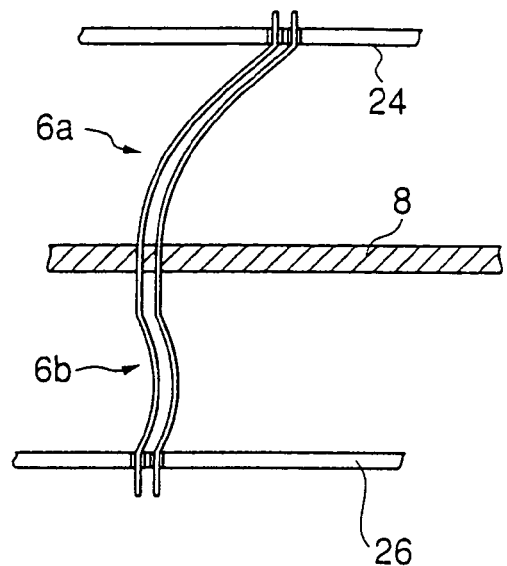
FIG. 21 is an illustration of a contactor having contact electrodes of which end portions are bent.

FIG. 21 shows an example in which the contact electrode is curved and a tip portion thereof is bent. That is, in the method of forming a contact electrode shown in FIG. 15, the LSI-side contact electrode 6a and the test-board-side contact electrode part 6b are not bent and inclined but deformed by curving and only a tip portion is bent so as to contact the tip portion with an object to be contacted at a desired angle.

Figure 22:
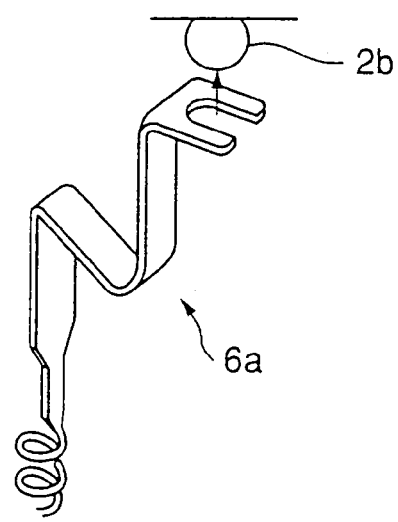
FIG. 22 is an illustration of a contactor having an end portion suitable for a protruding electrode of an LSI.

FIG. 22 shows an example in which a tip portion of the contact electrode is processed so as to appropriately contact with a protruding electrode of an LSI. That is, the tip portion of the LSI-side contact electrode part 6a formed by bending a belt-like conductive material is bent so as to be parallel to a surface of the LSI, and the thus-bent tip portion is formed in a furcate shape. By forming the tip portion of the LSI-side contact electrode part 6a in the shape of a fork as shown in FIG. 22, the LSI-side contact electrode part 6a can contact the protruding electrode 2b having a substantially sphere form in a state where the protruding electrode 2b if inserted between furcate parts of the tip portion. Thus, the LSI-side contact electrode part 6b is automatically positioned with respect to the protruding electrode 2b, and a contact area is increased.

Next, a description will be given of a contactor according to a sixth embodiment of the present invention.

Figure 23:
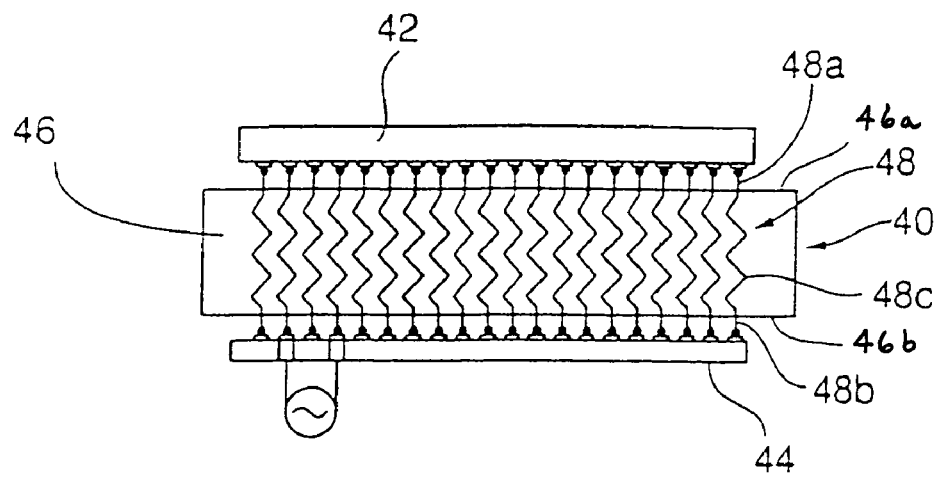
FIG. 23 is an illustration of a contactor according to a sixth embodiment of the present invention.

FIG. 23 shows a contactor 40 according to the sixth embodiment of the present invention. In FIG. 23, a contactor 40 is arranged between an electronic part 42 (an object to be contacted) such as an LSI and a test board 44 so as to electrically connect the electronic part 42 to the test board 44. The test board 44 is provided with a circuit for testing the electronic part 42, and the electronic part 42 is subjected to a burn-in test or a final test in a state where the electronic part 42 is connected to the test board 44 via the contactor 40.

The contactor 40 comprises a base 46 formed of an insulating material and a plurality of contact electrodes 48 which penetrate and extend through the base 46. The base 46 is formed in the shape of a plate, and has a surface 46a (first surface), which is arranged to face the electronic part 42, and a surface 46b (second surface), which is arranged to face the test board 44.

An end (first end) 48a of each of the contact electrodes 48 is formed to protrude form the surface 46a of the base 46 so as to be brought into contact with a respective electrode terminal of the electronic part 42. On the other hand, the other terminal of each of the contact electrodes 48 is formed to protrude from the surface 46b of the base 46 so as to be brought into contact with a respective terminal of the test board 44. FIG. 23 shows a state where the contact electrodes 48 of the contactor A base 46 is formed of a material having insulation and elasticity, such as silicone rubber, in the shape of a plate, and each of the contact electrodes 48 has conductive parts 48c which penetrate and extend through the base 46 in a direction of thickness.

That is, the first end and second end of each contact electrode 48 are electrically connected to each other by the conductive part 48c, and the contact electrodes 48 are supported in a predetermined arrangement. The conductive part 48c of the contact electrode 48 is formed as an elastic body such as a coil spring or a bent spring. That is, the conductive part 48c has a function not only electrically connect the first end 48a and the second end 48b to each other but also supply an appropriate pressure to the first end 48a and the second end 48b in cooperation with the elasticity of the base 46. Therefore, when the contactor 40 is inserted between the test board 44 and the electronic part 42, the conductive part 48c of the contact electrode 48 elastically deforms (compression) so as to generate an appropriate contact pressure.

In order to attain such an elastic deformation of the conductive part 48c, the base 46 also needs to be formed of an elastically deformable material. As such a material, the silicone rubber which has insulation and elasticity is preferably used.

As an example of the contactor 40 according to the present embodiment, a contactor was produced by embedding 10×10=100 pieces of metal springs (contact electrodes) in a silicone rubber (base). The metal springs were arranged in a matrix with a pitch of 0.5 mm in a predetermined mold die, and a mixture of a silicone rubber (manufactured by Toray, catalog number SH955RTV) and a curing agent was poured into the mold die. Then, the silicone rubber was cured at 60° C. for 5 hours so as to form a 20 cm square flat contactor having a thickness of 3 mm as shown in FIG. 23. The thus-formed contactor was capable of having a load of 0.5 gf per contact electrode at a room temperature, and it was able to contact all contact electrodes with an object to be contacted (electrode terminals of an electronic part and terminals of a test board) with a load of 50 gf as the whole contactor. Moreover, whether the height of the contact part of the object to be contacted varied to some extent or a distance of a space where each contact electrode is arranged varied, it was able to contact all contact electrodes at an appropriate contact pressure.

Figures 24A, 24B, 24C:
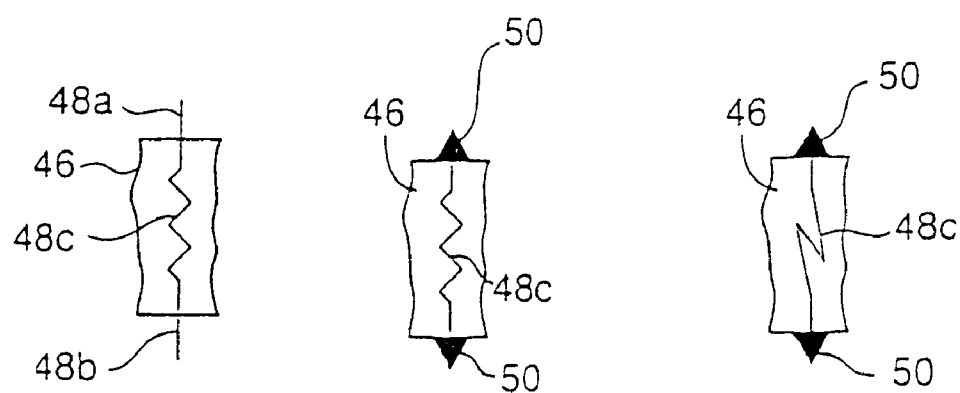
FIG. 24 is variations of the contactor shown in FIG. 23.

FIGS. 24A, 24B and 24C show examples of the contact electrode 48. In the example shown in FIG. 24A, the contact electrode 48 is formed as a spring of a metal wire and the conductive part 48c, which is embedded in the base, is formed as a coil spring. Additionally, opposite ends of the wire forming the spring are used as the contact terminals (first and second ends). In the example shown in FIG. 24B, the first and second ends 48a and 48b are formed as protruding electrodes (bumps) 50 protruding from the base 46 and the conductive part 48c is formed as a coil spring. Moreover, in the example shown in FIG. 24C, the first and second ends 48a and 48b are formed as protruding electrodes and the conductive part 48c which connects the first and second ends is formed as a bent spring.

Moreover, in the above-mentioned examples, a wire such as a gold wire is preferably used for the spring constituting the contact electrode 48, and the gold wire may be plated by nickel or the like. Moreover, the contact electrode 48 may be formed by a wire of a shape-memory alloy instead of the gold wire.

By forming the contact electrode 48 by a wire of a shape metal alloy having a predetermined transformation point instead of the gold wire, the shape of the contact electrode 48, which has been deformed due to repeated use, can be restored to an original shape. That is, since the contact electrode 48 is repeatedly used for testing, when the number of times of use increases, the recovery force of the spring becomes week, and the original shape cannot be restored. In such a case, there is a possibility of causing a contact failure. In order to prevent such a problem, the wire of a shape-memory alloy is used.

The contact electrode 48 was formed by a shape-memory alloy having a transformation point of 50° C. When the contact electrode 48 lost an original configuration after using for a certain period of time, the contact electrode 48 was heated to a temperature exceeding the transformation point of 50° C. Then, the contact electrode 48 returned to the original configuration, and became usable again. Moreover, when the original configuration of the contact electrode 48 was recovered, the spring nature of the contact electrode 48 was returned to a good characteristic and was capable of withstand repeated use. As such a shape memory alloy, Ni—Ti alloy, Ni—Ti—Co alloy, or Ni—Ti—Cu alloy can be used.

Moreover, the contactor was formed using a shape-memory alloy having a transformation point of 100° C. Then, the contactor was brought into contact with an object to be contacted, and the object to be contacted was subjected to a burn-in test at a temperature exceeding 120° C. In the burn-in test, the test board was contacted with the object to be contacted via the contactor at a room temperature and the object together with the contactor was gradually heated. Contact fault disappeared when the heating temperature exceeded 100° C. Moreover, it was able to perform the burn-in test without problems, such as a contact fault, also in a temperature as high as 120° C. or more.

In the above-mentioned contactor 40, the base 46 is formed by an elastic body, and is elastically deformable in a direction of thickness as well as in a direction perpendicular to the direction of thickness. That is, the contactor can be easily deformed in a direction parallel to the surface of the base thereof. If the base 46 deforms in the direction parallel to the surface thereof, the first and second ends of the contact electrode 48 are displaced. Therefore, it is preferable to constitute the base 46 so as not to easily deform in the direction parallel to the surface thereof.

Figure 25:
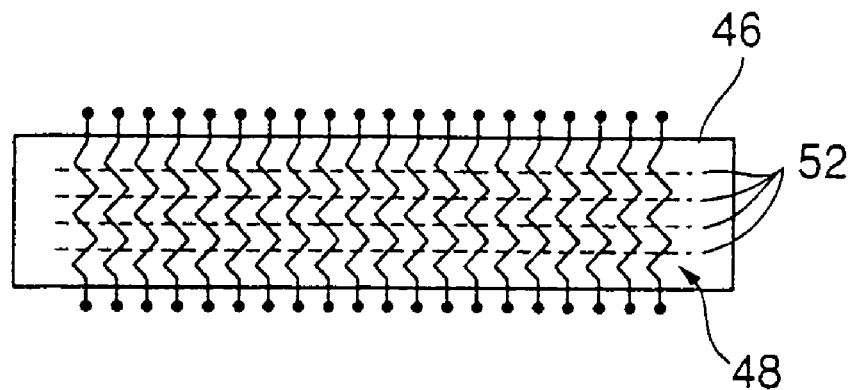
FIG. 25 is an illustration of a contactor in which a deformation in a direction perpendicular to a direction of a thickness of an insulating board.

Thus, in the example shown in FIG. 25, mesh-like flat reinforcing members 52 are embedded in the base 46 in a stacked state. Thereby, the base 46 is elastically deformable in the direction of thickness but deformation in the direction perpendicular to the direction of thickness is restricted by the reinforcing members 52. Namely, it is possible to form a base of a contactor which has less deformation in a direction perpendicular to a direction of thickness while maintaining elastic deformation in the direction of thickness. In the example shown in FIG. 25, the mesh-like flat reinforcing members 52 may be formed of a shape-memory alloy.

When the reinforcing members 52 were formed by a shape-memory alloy having a transformation point of 50 doc and the contactor was produced using the thus-formed reinforcing members 52, it was able to correct deviation of dimension of the contactor due to repeated compression in the direction perpendicular to the direction of thickness by heating the contactor at a temperature exceeding 50 doc after several time use at a room temperature. Thereby, it was able to greatly elongate the service life of the contactor.

Figure 26:
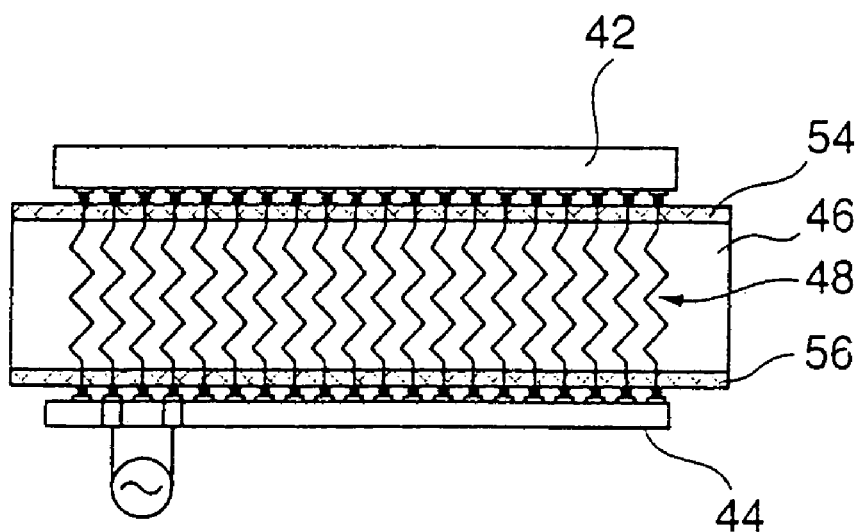
FIG. 26 is an illustration showing a contactor having layers on surfaces of an insulating board, the layers having the same thermal expansion coefficient with an object to be tested.

FIG. 26 shows an example in which a covering layer is provided on the surface of the base 46 of the contactor 40. In the example shown in FIG. 26, a first covering layer 54 is formed on a first surface 46a of the base 46, and a second covering layer 56 is formed on a second surface 46b of the base 46.

The first covering layer 54 is formed of a material having a thermal expansion coefficient equivalent to a thermal expansion coefficient of the base of the electronic part 42. A first end of the contact electrode penetrates through and protrudes from the first covering layer 54. Moreover, the second covering layer 56 is formed of a material having a thermal expansion coefficient equivalent to a thermal expansion coefficient of the test board 44. A second end of the contact electrode penetrates through and protrudes from the second covering layer 54.

For example, if the electronic part 42 is an LSI formed on a silicon wafer, it is preferable to form the first covering layer 54 by a material (crystal silicon) of the silicon wafer. Moreover, if the test board 44 if formed of a glass-epoxy substrate, the layer of glass epoxy is formed as the second covering layer 56.

Thus, even if the thermal expansion coefficient of the contactor differs from that of the electronic part 42 or the test board, the contact ends of the contact electrode 48 do not cause position offset with respect to the electrode terminal of the electronic part 42 and the terminals of the test board 44 by the use of the first covering layer 54 and the second covering layer 56. That is, when the contactor 40 and the electronic part 42 are heated, the first end 48a of the contact electrode 48 does not move relative to the electrode terminal of the electronic part 42 since the first covering layer 54 thermally expands at the same rate as the electronic part 42. It should be noted that since the base 46 is formed of an elastically deformable material, the base 46 does not restrict the thermal expansion of the first covering layer 54. Moreover, when the contactor 40 and the test board 44 are heated, the second end 48b of the contact electrode 48 does not move relative to the terminal of the test board 44 since the second covering layer 56 thermally expands at same rate as the test board 44. In addition, since the base 46 is formed of an elastically deformable material, the base 46 does not restrict the thermal expansion of the second covering layer 56.

According to the contactor of the present embodiment, the contactor for simultaneously testing LSIs of the wafer state, which was hard to realize by the conventional technique, can be achieved with a simple structure at a low cost. Moreover, a simultaneous contact can be made in a whole wafer at a low pressure. Furthermore, since there is no position offset of the contact part due to thermal expansion, a stable contact can be achieved from a room temperature to a eating state. Thereby, a burn-in test and a heat-cycle test can be accurately performed in a wafer level, and it becomes possible to sort a defective piece of bare chips or wafer-level CSPs at a low cost before individualizing into a bare-chip size.

The present invention is not limited to the specifically disclosed embodiments, and variations and modifications may be made without departing from the scope of the present invention.

The present application is based on Japanese priority application No. 2001-027399 filed on Feb. 2, 2001, the entire contents of which are hereby incorporated by reference.

What is claimed is:

1. A contactor configured to be arranged between a semiconductor device and a test board so as to contact the semiconductor device to the test board, the contactor comprising:
a plate-like substrate formed of an insulating material, the substrate having a first surface facing said semiconductor device and a second surface facing said test board; and
a plurality of contact electrodes embedded and fixed in the substrate,
wherein each of said contact electrodes has a first end portion, a second end portion and a conductive portion between the first end portion and second end portion, the first end portion protruding from a first surface of said substrate, the second end portion protruding from a second surface of said substrate, and said substrate and said conductive portion are deformable in a direction of a thickness of said substrate; wherein
said substrate is an elastic material formed of plastic or rubber, and wherein said substrate contains a covering layer member having a thermal expansion coefficient the same as that of the test board.

2. A contactor configured to be arranged between a semiconductor device and a test board to as to contact the semiconductor device to the test board, the contactor comprising:
a plate-like substrate formed of an insulating material, the substrate having a first surface facing said semiconductor device and a second surface facing said test board; and
a plurality of contact electrodes embedded and fixed in the substrate,
wherein each of said contact electrodes has a first end portion, a second end portion and a conductive portion between the first end portion and second end portion, the first end portion protruding from a first surface of said substrate, the second end portion protruding from a second surface of said substrate, and said substrate and said conductive portion are deformable in a direction of a thickness of said substrate; and
wherein a first coating layer is formed on said first surface of said substrate, the first coating layer having a thermal expansion coefficient substantially equal to that of a substrate of said semiconductor device, and the first end portion of said contact electrode protrudes from said first coating layer.

3. A contactor configured to be arranged between a semiconductor device and a test board so as to contact the semiconductor device to the test board, the contactor comprising:
a plate-like substrate formed of an insulating material, the substrate having a first surface said semiconductor device and a second surface facing said test board; and
a plurality of contact electrodes embedded and fixed in the substrate;
wherein each of said contact electrodes has a first end portion, a second end portion and a conductive portion between the first end portion and second end portion, the first end portion protruding from a first surface of said substrate, the second end portion protruding from a second surface of said substrate, and said substrate and said conductive portion are deformable in a direction of a thickness of said substrate; and wherein a second coating layer is formed on said second surface of said substrate, the second coating layer having a thermal expansion coefficient substantially equal to that of said test board, and the second end portion of said contact electrode protrudes from said second coating layer.

* * * * *